United States Patent
Wu et al.

(10) Patent No.: US 8,462,564 B1
(45) Date of Patent: *Jun. 11, 2013

(54) FLASH MEMORY PROGRAMMING POWER REDUCTION

(75) Inventors: Yonggang Wu, Santa Clara, CA (US);
Guowei Wang, Cupertino, CA (US);
Nian Yang, Mountain View, CA (US);
Sachit Chandra, Sunnyvale, CA (US);
Aaron Lee, Mountain View, CA (US)

(73) Assignee: Spansion LLC, Sunnyvale, CA (US)

( * ) Notice: Subject to any disclaimer, the term of this patent is extended or adjusted under 35 U.S.C. 154(b) by 135 days.

This patent is subject to a terminal disclaimer.

(21) Appl. No.: 13/090,981

(22) Filed: Apr. 20, 2011

Related U.S. Application Data

(63) Continuation of application No. 11/229,667, filed on Sep. 20, 2005, now Pat. No. 7,957,204.

(51) Int. Cl.
| | |
|---|---|
| *G11C 7/12* | (2006.01) |
| *G11C 8/08* | (2006.01) |
| *G11C 8/12* | (2006.01) |
| *G11C 16/12* | (2006.01) |

(52) U.S. Cl.
USPC ............ 365/189.09; 365/185.11; 365/185.18; 365/189.11; 365/202; 365/230.03

(58) Field of Classification Search
USPC ............. 365/185.11, 185.13, 185.18, 189.09, 365/189.11, 202, 230.03, 185.16
See application file for complete search history.

(56) References Cited

U.S. PATENT DOCUMENTS

| | | | |
|---|---|---|---|
| 5,270,979 A | * | 12/1993 | Harari et al. ............ 365/185.09 |
| 5,291,446 A | | 3/1994 | Van Buskirk et al. |
| 5,301,097 A | | 4/1994 | McDaniel |
| 5,430,674 A | | 7/1995 | Javanifard |
| 5,444,655 A | | 8/1995 | Yoshikawa |
| 5,473,573 A | | 12/1995 | Rao |
| 5,539,688 A | | 7/1996 | Yiu et al. |
| 5,638,326 A | | 6/1997 | Hollmer et al. |
| 5,751,637 A | | 5/1998 | Chen et al. |
| 5,787,039 A | | 7/1998 | Chen et al. |
| 5,890,192 A | | 3/1999 | Lee et al. |
| 5,892,710 A | | 4/1999 | Fazio et al. |
| 6,044,022 A | | 3/2000 | Nachumovsky |
| 6,101,125 A | | 8/2000 | Gorman |
| 6,233,177 B1 | | 5/2001 | Shokouhi et al. |

(Continued)

FOREIGN PATENT DOCUMENTS

| | | |
|---|---|---|
| WO | WO 03/063167 A2 | 7/2003 |
| WO | WO 2005/106891 A1 | 11/2005 |

OTHER PUBLICATIONS

Co-pending U.S. Appl. No. 11/229,667, filed Sep. 20, 2005 entitled "Flash memeory Programming Power Reduction", by Wu et al., 30 pages.

(Continued)

*Primary Examiner* — John H. Hur
(74) *Attorney, Agent, or Firm* — Harrity & Harrity, LLP

(57) ABSTRACT

A non-volatile memory device includes an array of non-volatile memory cells. When programming the memory cells, a voltage supply source is used that includes multiple independent charge pumps. The independent charge pumps supply the programming voltage to different ones of bit lines in the array of memory cells. Using multiple charge pumps tends to reduce output voltage fluctuations and thereby reduce power loss.

20 Claims, 9 Drawing Sheets

U.S. PATENT DOCUMENTS

| | | |
|---|---|---|
| 6,272,670 B1 | 8/2001 | Van Myers et al. |
| 6,295,228 B1 | 9/2001 | Pawletko et al. |
| 6,327,181 B1 | 12/2001 | Akaogi et al. |
| 6,424,570 B1 | 7/2002 | Le et al. |
| 6,426,893 B1 | 7/2002 | Conley et al. |
| 6,452,869 B1 | 9/2002 | Parker |
| 6,487,121 B1 | 11/2002 | Thurgate et al. |
| 6,496,410 B1 | 12/2002 | Parker |
| 6,535,419 B2 | 3/2003 | Parker et al. |
| 6,538,923 B1 | 3/2003 | Parker |
| 6,570,785 B1 | 5/2003 | Mangan et al. |
| 6,724,662 B2 | 4/2004 | Manea |
| 6,747,900 B1 | 6/2004 | Park et al. |
| 6,775,187 B1 | 8/2004 | Hamilton et al. |
| 6,816,001 B2 | 11/2004 | Khouri et al. |
| 6,952,366 B2 | 10/2005 | Forbes |
| 6,996,021 B2 | 2/2006 | Derner et al. |
| 7,020,018 B2 | 3/2006 | Hsieh et al. |
| 7,149,110 B2 | 12/2006 | Tran et al. |
| 7,151,701 B2 | 12/2006 | Combe et al. |
| 7,177,184 B2 | 2/2007 | Chen |
| 7,190,616 B2 | 3/2007 | Forbes et al. |
| 7,295,475 B2 | 11/2007 | Akaogi et al. |
| 7,352,626 B1 | 4/2008 | Wu et al. |
| 7,957,204 B1 * | 6/2011 | Wu et al. .......... 365/189.09 |
| 2001/0040836 A1 | 11/2001 | Mori et al. |
| 2002/0167844 A1 | 11/2002 | Han et al. |
| 2003/0093233 A1 | 5/2003 | Rajguru |
| 2003/0142544 A1 | 7/2003 | Maayan et al. |
| 2003/0172309 A1 | 9/2003 | Cioaca |
| 2004/0027857 A1 | 2/2004 | Ooishi |
| 2004/0037113 A1 | 2/2004 | Ooishi |

OTHER PUBLICATIONS

2002 IEEE International Solid State Circuits Conference, Session 6, "SRAM and Non-Volatile Memories," Feb. 4, 2004, 6 pages.

2002 IEEE International Solid State Circuits Conference, 23 pages.

International Search Report and Written Opinion dated Jan. 15, 2007.

\* cited by examiner

FLASH MEMORY PROGRAMMING POWER REDUCTION

RELATED APPLICATIONS

This application is a continuation of Ser. No. 11/229,667, filed Sep. 20, 2005, the entire disclosure of which is incorporated herein by reference.

TECHNICAL FIELD

The present invention relates generally to non-volatile memory devices, and more specifically, to data programming operations for non-volatile memory devices.

BACKGROUND ART

Flash memory is a common type of non-volatile semiconductor memory device. Non-volatile refers to the trait of retaining stored data when power is turned off. Because Flash memory is non-volatile, it is commonly used in power conscious applications, such as in battery powered cellular phones, personal digital assistants (PDAs), and in portable mass storage devices such as memory sticks.

Flash memory devices typically include multiple individual components formed on or within a substrate. Such devices often comprise a high density section and a low density section. For example, a Flash memory may include one or more high density core regions and a low density peripheral portion formed on a single substrate. The high density core regions typically include arrays of individually addressable, substantially identical memory cells. The low density peripheral portion may include input/output (I/O) circuitry, circuitry for selectively addressing the individual cells (such as decoders for connecting the source, gate and drain of selected cells to predetermined voltages or impedances to effect designated operations of the cell such as programming, reading or erasing), and voltage regulation and supply circuitry.

In one particular type of Flash memory architecture, called NOR Flash memory, memory cells within the core portion are coupled together in a circuit configuration in which each memory cell has a drain, a source, and a stacked gate. In operation, memory cells may be addressed by circuitry in the peripheral portion to perform functions such as reading, erasing, and programming of the memory cells.

When programming and erasing NOR-type Flash memory cells, relatively large voltages are typically required. To generate these voltages, voltage regulation and supply circuitry, such as a charge pump, may be implemented in the low density peripheral portion. The charge pump can generate programming voltages larger than the supply voltage of the Flash memory chip.

DISCLOSURE OF THE INVENTION

One aspect is directed to a non-volatile memory device comprising an array of non-volatile memory cells and a voltage supply generator. The voltage supply generator is configured to generate a programming voltage for programming a plurality of the memory cells, the voltage supply generator including a plurality of charge pump groups.

Another aspect is directed to a method of programming a non-volatile memory array. The method includes receiving a program window containing a predetermined number of bits that are to be written to the memory, determining which of the predetermined number of bits are to be programmed in the memory array, and turning on a number of a plurality of charge pumps based on the determined number of bits that are to be programmed. The method further includes programming the bits that are determined to be programmed by supplying power from the turned-on charge pumps to memory cells in the memory array corresponding to the bits that are determined to be programmed.

BRIEF DESCRIPTION OF THE DRAWINGS

Reference is made to the attached drawings, wherein elements having the same reference number designation may represent like elements throughout.

BEST MODE FOR CARRYING OUT THE INVENTION

Techniques described below relate to a Flash memory programming technique that use groups of independent charge pumps to supply power during memory programming. These independent charge pumps may reduce power loss and output voltage fluctuations.

Memory Device Overview

Figure 1:
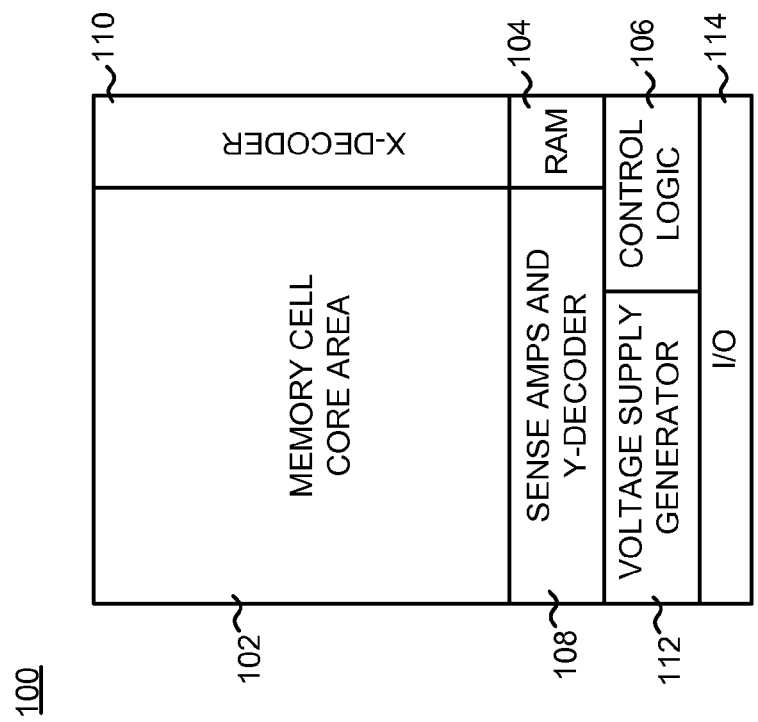
FIG. 1 is a block diagram illustrating an exemplary high-level implementation of a memory device.

FIG. 1 is a block diagram illustrating an exemplary high-level implementation of a memory device 100. Memory device 100 may be a Flash memory device implemented as an integrated circuit.

As shown in FIG. 1, memory device 100 includes a core area 102. Core area 102 may include arrays of high density memory cells, such as, for example, SONOS-type (silicon-oxide-nitride-oxide-silicon) NOR memory cells, where the nitride layer acts as the charge storage element. More specifically, core area 102 may include multiple M×N memory arrays of substantially identical memory cells.

The memory cells in area 102 may be implemented such that each memory cell can store two or more bits. In one such multi-bit per memory cell technology, called MirrorBit™, the intrinsic density of a Flash memory array can be doubled by storing two physically distinct charges on opposite sides of a memory cell. Each charge, representing a bit within a cell, serves as a binary unit of data (e.g. either "1" or "0"). Reading or programming one side of a memory cell occurs independently of the data that is stored on the opposite side of the cell.

Although shown as a single block in FIG. 1, core area 102 may be implemented as a number of memory cell arrays. Each such memory cell array may be associated with X-decoder 110 and Y-decoder 108. X-decoder 110 and Y-decoder 108 may decode address information, such as addresses received by memory device 100 that define a specific byte or word (or groups of bytes or words) that are to be written to or read from. The decoded addresses specify the appropriate physical lines in the memory cell array(s) that are to be used.

Y-decoder 108 may also include appropriate sense amplifier circuitry. Sense amplifiers may be used to sense the programmed or non-programmed state of the memory cells in core area 102.

Random access memory (RAM) 104 may include memory, such as static dynamic random access memory (SRAM) or dynamic random access memory (DRAM) type memory, that can serve as a memory cache between core area 102 and I/O lines 114. Relative to the memory cells in core area 102, RAM 104 may be a higher speed memory and may be a volatile memory (i.e., loses its data when powered down). I/O buffers 114 may provide buffering to facilitate data transfer between RAM 104 and memory device 100 and/or between core area 102 and RAM 104.

Voltage supply generator 112 may act as a power supply for the programming, reading, and erasing functions performed on the memory cells in core area 102. Programming and erasing the memory cells, in particular, may require supply voltages larger than those supplied to memory device 100. For example, memory device 100 may be powered from a 3.5 volt source while a program operation may require a higher voltage source. Voltage supply generator 112 may use one or more charge pumps to generate these higher voltages. Consistent with an aspect of the invention and as described in more detail below, voltage supply generator 112 may include a charge pump divided into groups of independent charge pumps.

Control logic 106 may generally control Y-decoder 108, X-decoder 110, RAM 104, voltage supply generator 112, and I/O lines 114 to control the read, programming, and erasing of memory cell core area 102. Control logic 106 may include a state machine that appropriately manipulates memory cell core area 102 based on input address, data, and control signals received by memory device 100 through I/O lines 114.

Figure 2:
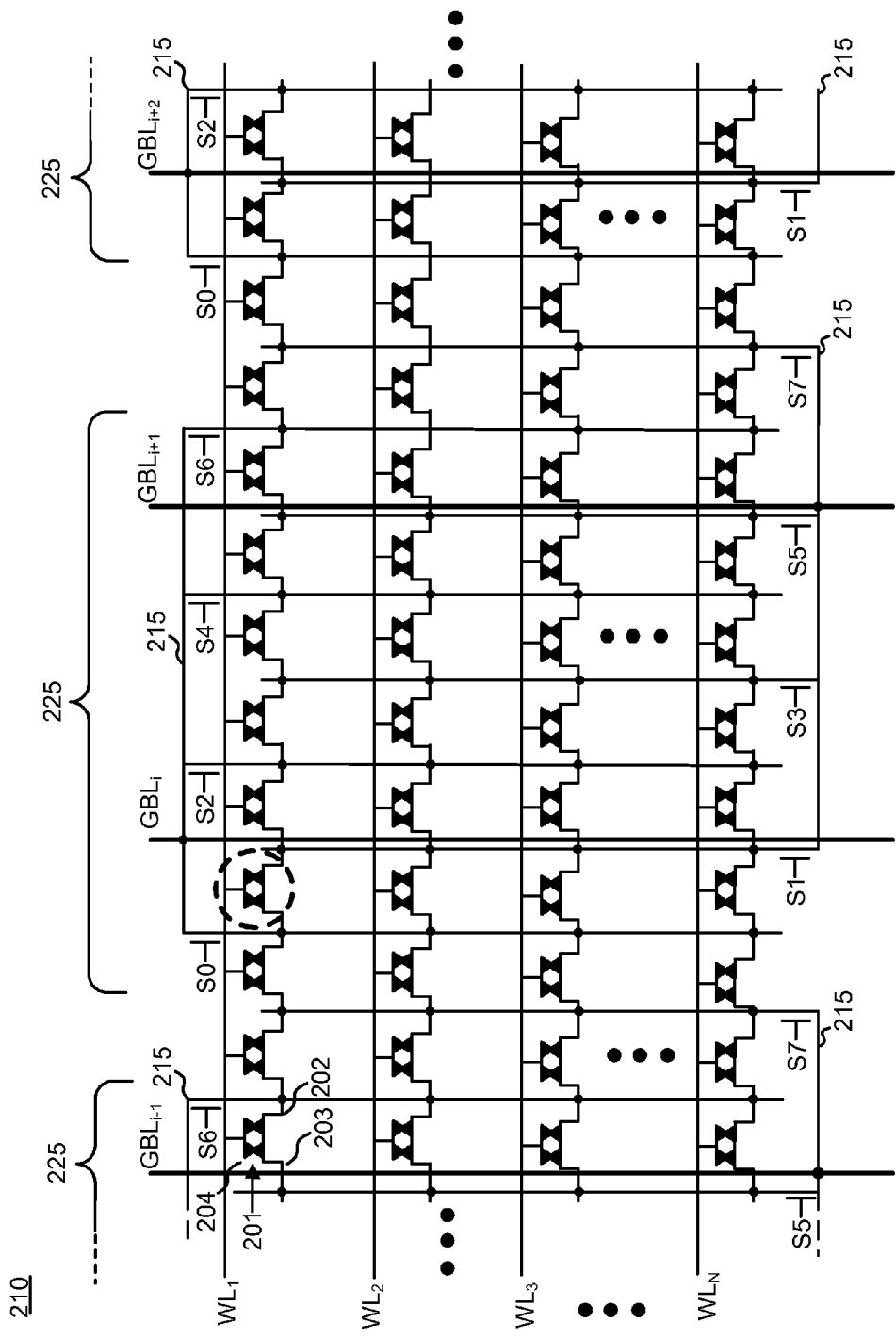
FIG. 2 is a diagram illustrating an exemplary portion of an array of memory cells implemented in the core area of the memory device shown in FIG. 1.

FIG. 2 is a diagram illustrating an exemplary portion of an array of memory cells implemented in core area 102, labeled as memory array 210. The array includes a number of substantially identical transistors 201 that act as memory cells 201. Each memory cell 201 includes a drain 202, a source 203, and a stacked gate region 204. Drain 202 and source 203 are interchangeable within a memory cell depending on the applied voltages and may be switched with respect to one another. The NOR configuration illustrated in FIG. 2 includes word lines (word lines $WL_1$ through $WL_N$) each connected to the gate region 204 of a number of memory cells 201 in a row. Bit lines are arranged orthogonally to the word lines in array 210. The bit lines include global bit lines ($GBL_{i-1}$, through $GBL_{i+2}$) that each connect to one or more additional bit lines 215. Voltages placed on additional bit lines 215 via a global bit line GBL may be controlled through select transistors (also called select switches) S0 through S7.

As illustrated in FIG. 2, select transistors S0 through S7 may be arranged in repeating groups 225 of select transistors. Corresponding select transistors in a number of groups may be controlled by the same control signal. For example, activating select transistor S0 may connect the particular bit line connected to S0 to voltages applied to $GBL_i$, $GBL_{i+2}$, etc. If select transistor S1 was also activated, $GBL_{i+1}$, $GBL_{i+3}$, etc., would also be connected to the opposing source/drain of a number of memory cells 201 in memory array 210. By also activating a word line WL, one memory cell in each group 225 may have its source, drain, and gate terminals all activated, thus allowing programming and reading of this select memory cell. As an example of selecting a particular memory cell within a group 225 (the memory cell within the circle in FIG. 2), assume that a voltage is placed on $WL_1$ and that S0 and S1 are turned-on and that voltages are placed on $GBL_i$ and $GBL_{i+1}$. At this point, this cell has voltages applied to its gate, source, and drain and may be programmed or read. Other memory cells 201 in other groups 225 can be simultaneously selected based on activation of the same WL and select transistors.

Although the memory cells 201 in core area 102 are shown as NOR memory cells, in some implementations, the circuitry in the peripheral regions of memory device 100 may provide an external interface that mimics an external interface normally provided by NAND-type Flash memories. In this situation, memory device 100, from the point of view of the user/circuit designer, can effectively be thought of as a NAND-type Flash device even though core area 102 includes NOR-type Flash memory.

Although only four bit lines and four word lines are shown in FIG. 2, one of ordinary skill in the art will recognize that a typical memory cell architecture will include many more cells in an array. For instance, in one implementation, core array 102 may include multiple memory cell arrays, each including 2048 bit lines and 256 word lines. The 2048 bit lines may correspond to 256 eight memory cell groups 225 of select transistors.

Figure 3:
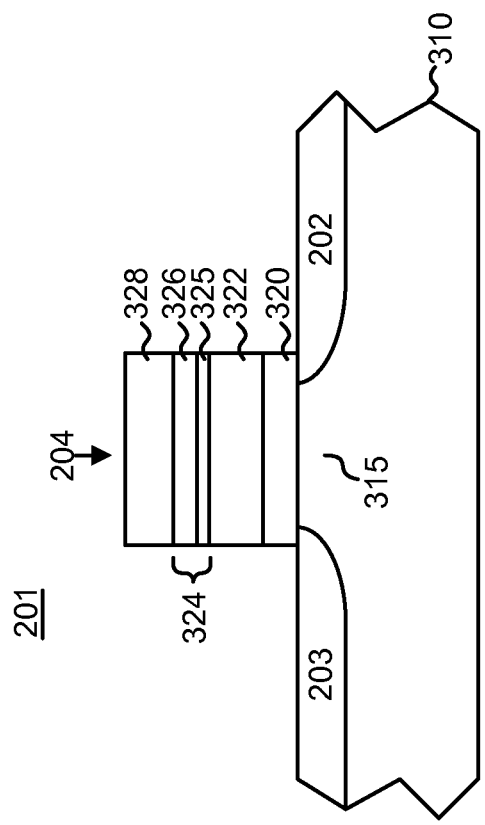
FIGS. 3 and 4 are diagrams illustrating a cross-section of an exemplary one of the memory cells shown in FIG. 2.

FIG. 3 is a diagram illustrating a cross-section of an exemplary one of memory cells 201 in more detail. Memory cell 201 may be formed on a substrate 310 and includes drain 202, source 203, and stacked gate 204. Substrate 310 may be formed of a semiconducting material such as silicon, germanium, or silicon-germanium. Drain and source regions 202 and 203 may be regions that are doped with n-type impurities, such as phosphorous or arsenic, or p-type impurities, such as boron. As previously mentioned, depending on the applied voltages, the functions of drain and source regions 202 and 203 may be reversed.

As shown in FIG. 3, stacked gate 204 is formed on channel region 315. Stacked gate 204 includes a number of layers, including a relatively thin gate dielectric layer 320, a charge storage layer 322, a second dielectric layer 324, and a control gate 328. Dielectric layer 320 may include an oxide, such as a silicon oxide (e.g., $SiO_2$).

Charge storage layer 322 may be formed on gate dielectric layer 320 and may include a dielectric material, such as a nitride (e.g., a silicon nitride). Layer 322 acts as a charge storage layer for the memory cell.

Charge storage layer 322 may be used to store one or more bits of information. In an exemplary implementation, charge storage layer 322 may store charges representing two separate bits of data by localizing the first and second charges to the respective left and right sides of charge storage layer 322. Each of the two charges of the memory cell 201 may be programmed independently by, for example, channel hot electron injection, to store a charge on each respective side of the charge storage layer 322. In this manner, the charges in charge storage layer 322 become effectively trapped on each respective side of charge storage layer 322 and the density of the resulting memory array may be increased as compared to memory devices that store only one bit of data per cell. In alternative implementations, charge storage layer 322 may store charge representing three or more bits of data for each memory cell 201.

Second dielectric layer 324 may be formed on layer 322 and may include a multi-layer structure, such as a first silicon oxide layer 325 and a second high dielectric constant (high- K) layer 326. High-K layer 326 may include, for example, an alumina, such as $Al_2O_3$. Dielectric layers 325 and 326 may together function as an inter-gate dielectric for memory cells 201. In alternate implementations, dielectric layer 324 may include a single layer, such as a silicon oxide or alumina.

Control gate 328 may be formed above second dielectric layer 324. Control gate 328 may be formed of polysilicon and may be connected to the word line of memory cell 201.

In operation, core area 102 of memory device 100 may be programmed by a channel hot electron injection process that injects electrons into charge storage layer 322. The injected electrons become trapped in charge storage layer 322 until an erase operation is performed.

As an example of a programming operation, memory cells 201 in core array 102 may be programmed by applying a relatively high voltage (e.g., 9 volts) to one of the word lines WL, such as $WL_1$, which effectively applies the voltage to control gates 328 of the memory cells that are coupled to $WL_1$. Simultaneously, a voltage may be applied across drain 202 and source 203 of one of the memory cells in a group 215. For example, approximately five volts may be applied to $GBL_i$ and $GBL_{i+1}$ may be grounded. Also, select transistors S0 and S1 may be turned on. These voltages generate a vertical and lateral electric field in the activated memory cell(s) (e.g., the circled memory cell in FIG. 2) along the length of the channel from the source to the drain. This electric field causes electrons to be drawn off the source and begin accelerating toward the drain. As they move along the length of the channel, they gain energy. If they gain enough energy, they can jump over the potential barrier of the dielectric layer 320 into one side of charge storing layer 322 and become trapped. In a read operation, the source and drain terminals are interchanged. For example, the corresponding read operation may be performed by applying approximately three volts to $WL_1$, grounding $GBL_i$, and applying approximately 1.5 volts to $GBL_{i+1}$.

Figure 4:
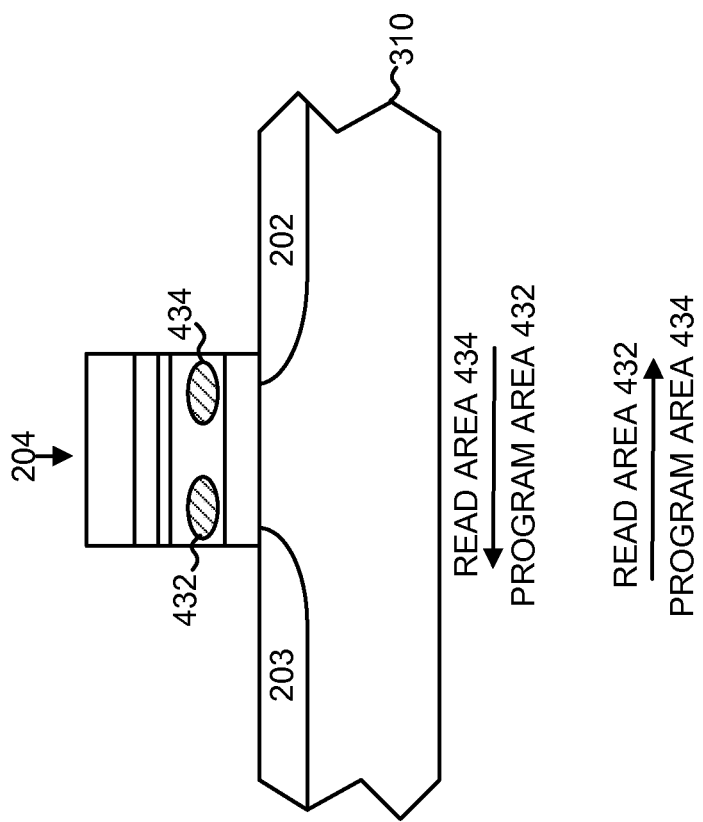

When two bits are stored in charge storage layer 322, the second bit is programmed in a manner similar to the first bit, except that the source and drain terminals are reversed in both directions. FIG. 4 is a diagram similar to FIG. 3. Additionally, FIG. 4 illustrates read and program directions for when memory cell 201 is used to store charges representing two independent bits. Memory cell 201 includes two separate charge storage areas 432 and 434 within charge storage layer 322. Each storage area 432 and 434 may define one bit. To program the left area 432 or read the right area 434, area 203 acts as the drain and receives a high voltage relative to area 202, which acts as the source. To program the right area 434 or read the left area 432, area 202 acts as the drain and receives a high voltage relative to area 203, which acts as the source. The arrows in FIG. 4 graphically illustrate the direction of charge flow.

Voltage Supply Generator 112

Multiple memory cells 201 in a row (i.e., the memory cells 201 having a common word line) can be simultaneously programmed by activating a programming voltage differential through the global bit lines and select switches S0 through S7 to the source and drain of each memory cell 201 that is to be programmed. Voltage supply generator 112 may provide this program voltage. In some implementations, it may be desirable to simultaneously activate the bit lines for a memory cell 201 from every group 225 of a row. Practically, however, the power drawn by each of the bit lines from voltage supply generator 112 may be too much to simultaneously program more than a portion of the total number of possible memory cells 201. For example, in the previously mentioned implementation, in which a memory cell array in core array 102 includes 2,048 memory cells, the memory cells 201 may be programmed in discrete programming "windows," in which each window includes, for example, 64 bits.

Voltage supply generator 112 may supply the voltages to the bit lines during programming. Voltage supply generator 112 may also include a charge pump to generate the voltages needed for programming. As previously mentioned, voltage supply generator 112 may include multiple independent charge pumps, as described in more detail below.

Figure 5:
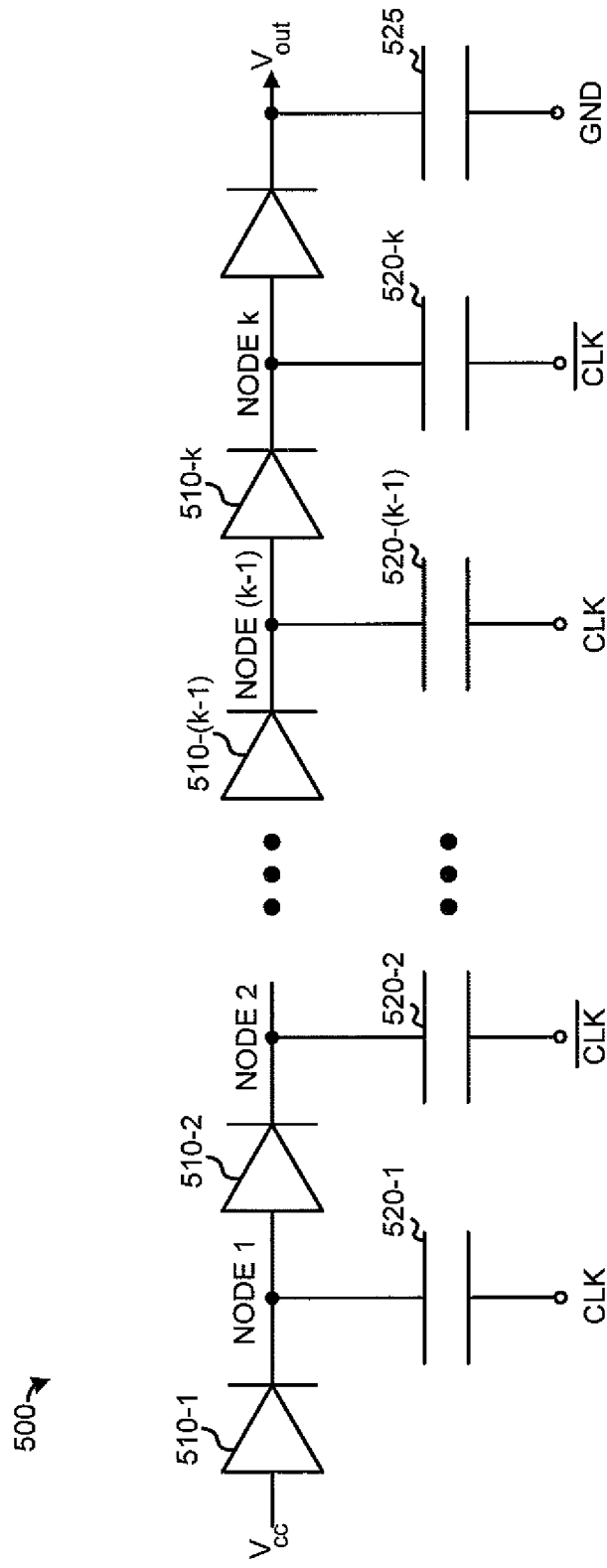
FIG. 5 is a diagram generally illustrating a conventional charge pump.

Before describing a charge pump implemented consistent with aspects of the invention, it may be helpful to generally describe operation of a conventional charge pump. FIG. 5 is a diagram generally illustrating a conventional charge pump 500. Charge pump 500 operates to increase the level of input voltage, $V_{cc}$, to generate a higher potential output voltage source, $V_{out}$.

Charge pump 500 includes a series of stages (node 1 thru node k). Charge pump 500 has at its input, a voltage, $V_{cc}$ which is transmitted through the series of stages that include diodes 510-1 through 510-$k$ and capacitors 520-1 through 520-$k$. Specifically, as shown in FIG. 5, $V_{cc}$ is supplied through diode 510-1 to a first node (node 1) including a capacitor 520-1. A second node (node 2) is connected to the first node (node 1) via diode 510-2 and includes a second capacitor 520-2. Charge pump 500 may include a number of such capacitor/diode stages (i.e., k stages). After the final stage of charge pump 500, the output voltage, $V_{out}$, is generated, across an output capacitor 525.

Capacitors 520-1 through 520-$k$, in addition to being connected to a respective node of charge pump 500, are also connected to a common clock input. Alternating ones of capacitors 520-1 through 520-$k$ may be connected to complementary clock signals. For example, the clock signal input to the odd stages of charge pump 500 may be an inverted version of the clock signal input to the even stages. By alternating the phase of the clock signals at the stages of charge pump 500, each node alternates between being charged by a previous node or charging a subsequent node. In this manner, charge is "pushed" through the various stages of the charge pump 500 until it reaches $V_{out}$.

Conventionally, a single charge pump, such as that shown in FIG. 5, may be used to provide a voltage supply to the drain bit lines of a memory array. Because the number of drain bit lines that are being powered at any given time in a programming window may vary, and because each bit line requires a fixed amount of programming current, varying the number of bit lines being powered can cause the output voltage of the charge pump to fluctuate significantly and consume excess power.

Figure 6:
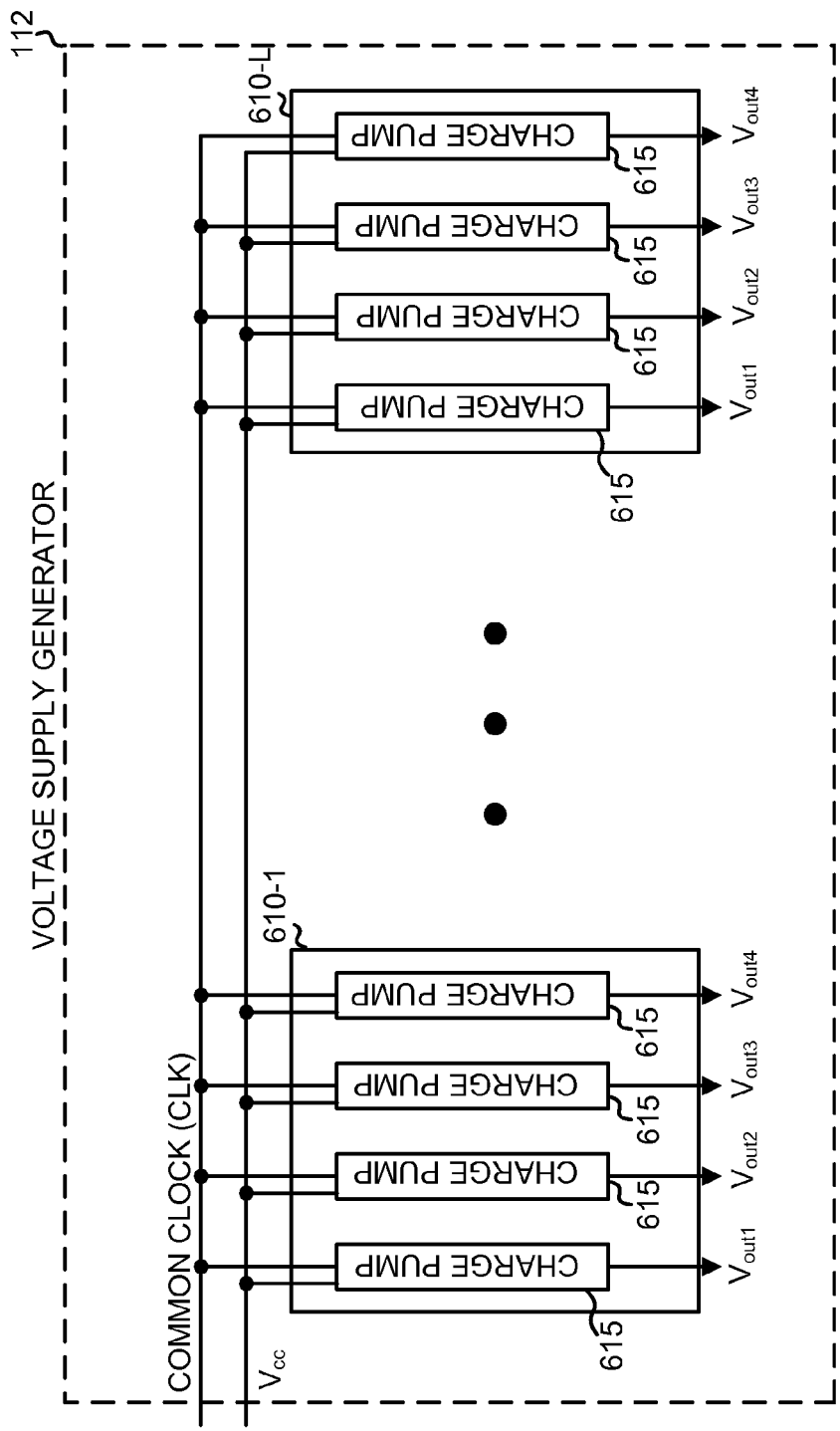
FIG. 6 is a diagram illustrating an exemplary charge pump portion of the voltage supply generator shown in FIG. 1.

FIG. 6 is a diagram illustrating an exemplary charge pump portion of voltage supply generator 112 consistent with an aspect of the invention. Voltage supply generator 112 may include a number of charge pump groups 610-1 through 610-L (collectively referred to as charge pump groups 610). Each of charge pump groups 610 may include a number of independent charge pumps 615. In one implementation, there may be four charge pump groups 610-1 through 610-4 (i.e., L equals four), each of which includes four independent charge pumps 615. In other implementations, there may be more or fewer charge pump groups 610 and independent charge pumps 615 in each group 610. Each independent charge pump 615 may share a common clock signal and input voltage signal, but may be otherwise implemented as independent charge pumps. Relative to an implementation that uses a single charge pump, independent charge pumps 615 may each be designed as lower capacity charge pumps, such as by using smaller capacitor values or a different number of stages than a charge pump in a single charge pump implementation. In one exemplary implementation, independent charge pumps 615 may each be five stage charge pumps in which each stage has a capacitor value ranging from approximately 40 pF to 60 pF. Independent charge pumps 615 may receive an input supply voltage of 1.8 volts (ranging from approximately 1.7 volts to 1.95 volts) and output a voltage of 6 volts (ranging from approximately 5.5 volts to 8 volts).

As previously mentioned, a programming operation may be performed by simultaneously programming a "window" containing a predetermined number of bits. Multiple programming operations may be sequentially performed until all the data that is to be programmed has been programmed. In the exemplary implementation described herein, the program window size will be described as being 256 bits wide. That is, programming is performed in 256-bit chunks. One of ordinary skill in the art will recognize that other program window sizes could be used.

Figure 7:
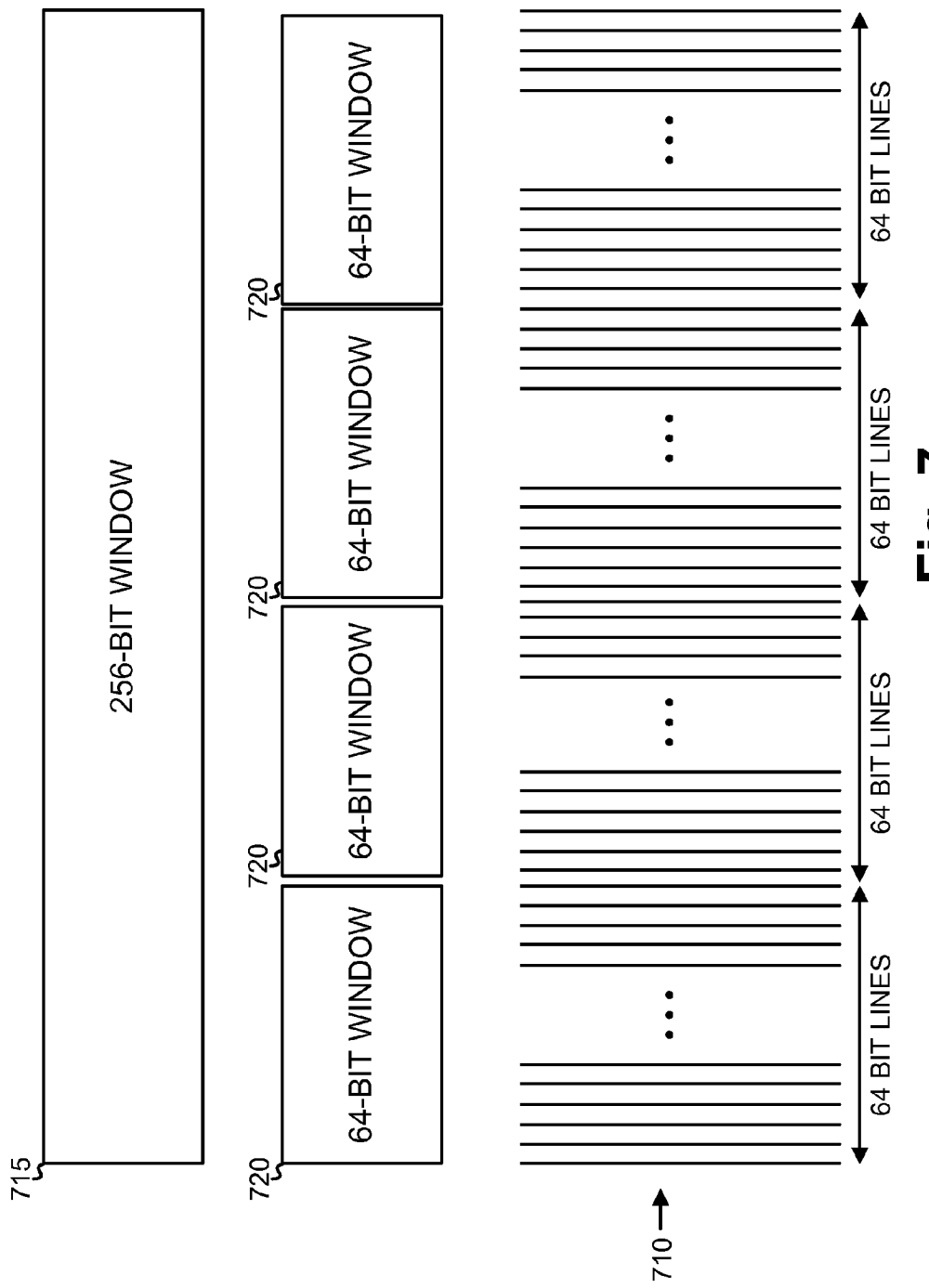
FIG. 7 is a diagram illustrating a programming window for the memory device of FIG. 1.

A programming window 715 is illustrated in FIG. 7. Programming window 715 may include the 256 bits that are to be written to memory cell core area 102 and may be mapped to 256 drain bit lines 710 in core area 102. Based on each of the bits in programming window 715, a corresponding drain bit line 710 will be either activated or not activated via the global bit lines and select transistors S0 through S7 (not shown in FIG. 7) to source current on the activated drain bit lines from charge pump groups 610. Programming window 715 may be further subdivided into sub-windows 720, such as by subdividing the 256 bits in programming window 715 into four 64-bit windows 720. In one implementation, to further decrease the load on voltage supply generator 112, sub-windows 720, instead of all being programmed simultaneously, may be programmed sequentially relative to one another.

Figure 8:
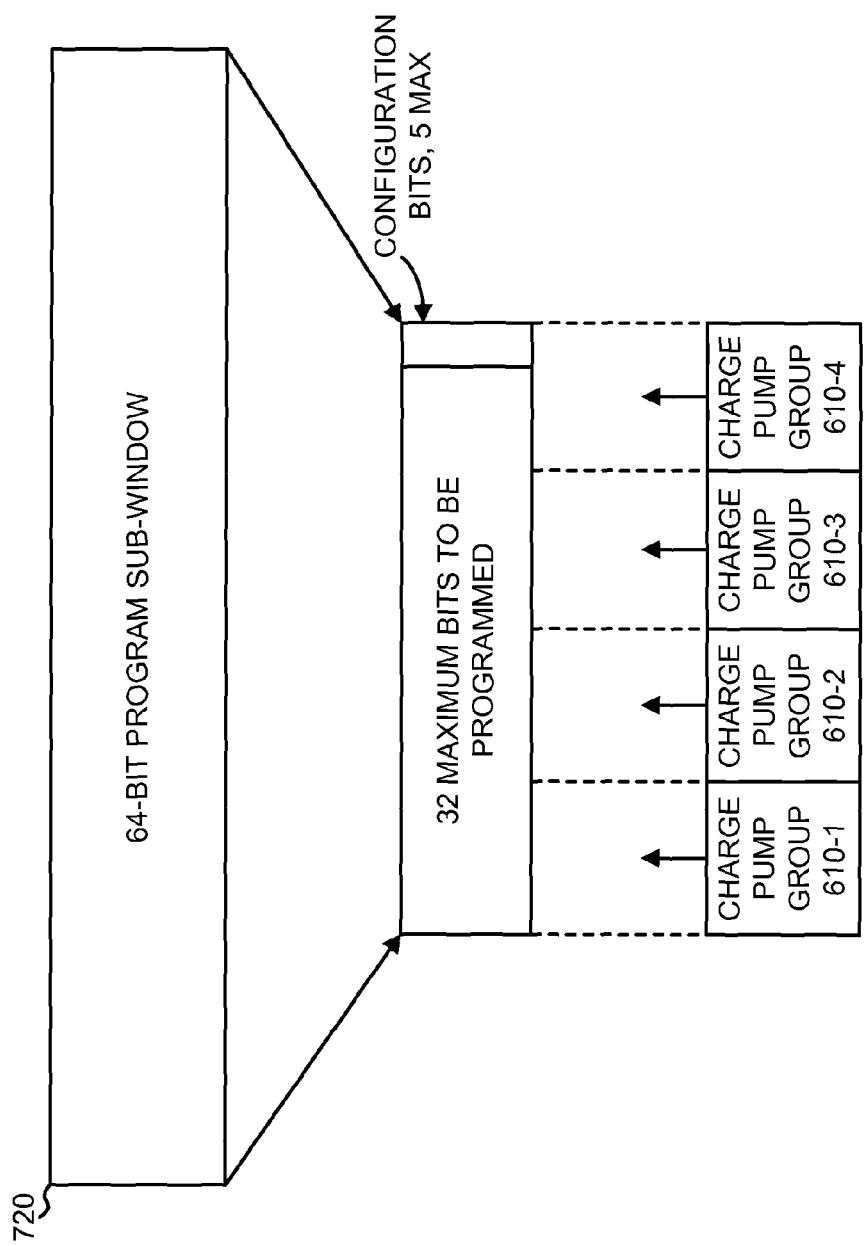
FIG. 8 is a diagram illustrating an exemplary logical correspondence between bits in a sub-window and the charge pump groups shown in FIG. 6.

FIG. 8 is a diagram illustrating an exemplary logical correspondence between bits in one of sub-windows 720 and charge pump groups 610. For this example, four charge pump groups, labeled as groups 610-1 through 610-4, are illustrated.

Although sub-window 720 includes 64 bits, a programming technique known as the inverse programming method may be used, which insures that at most, only half of these bits (i.e., 32) will actually need to be programmed to their respective memory cells. Additionally, memory configuration bits that are not related to the substantive data may also need to be programmed with these 32 (maximum) number of bits. These configuration bits may include bits such as a spare bit, indication bit, and dynamic reference bit. In one implementation, a maximum of five configuration bits may need to be programmed for each sub-window 720, giving 37 total maximum bits for programming for each 64-bit sub-window 720.

The inverse programming method dynamically selects how to interpret a programmed cell based on the data in sub-window 720. For example, if a non-programmed memory cell (i.e., a cell with no stored charge) is normally interpreted as being a logical one, and sub-window 720 includes all logical zeros, instead of programming all the bits in sub-window 720 (i.e., 64 bits), the non-programmed memory cells in sub-window 720 may instead be interpreted as corresponding to a logic zero. In this manner, instead of programming all 64 bits of sub-window 720, none of the bits in sub-window 720 need to be programmed. In this example, as few as one configuration bit may be programmed, such as the dynamic reference bit, to indicate that the memory cells in the sub-window are to be interpreted with non-programmed memory cells being a logic zero.

Charge pump groups 610-1 through 610-4 may each provide a power supply to predetermined portions of the drain bit lines that are to be programmed. In one implementation, charge pump groups 610-1 through 610-3 may each act as a power supply for up to nine bit lines that are to be programmed and charge pump group 610-4 may act as a power supply for up to the last ten bit lines. Charge pumps 615 within charge pump groups 610 may be further divided among the bits assigned to a charge pump group. In the exemplary implementation given, in which there are four charge pump groups 610, each containing four independent charge pumps 615, each charge pump 615 may act as a power supply for no more than two or three bit lines.

Advantageously, because each active bit line consumes constant current, using multiple independent charge pumps tends to decrease large voltage fluctuations caused by large differences in the number of bit lines that are being programmed. For example, if only a single charge pump was used, and a first programming sub-window 720 required programming of 1 bit and a subsequent programming sub-window 720 required programming of 32 bits, current drain caused by the subsequent programming would be approximately 32 times that of the first programming. This situation may cause relatively large voltage fluctuations in the power supply. By decreasing the number of bit lines supported by the charge pump, voltage fluctuations may be reduced, thereby consuming less power.

Figure 9:
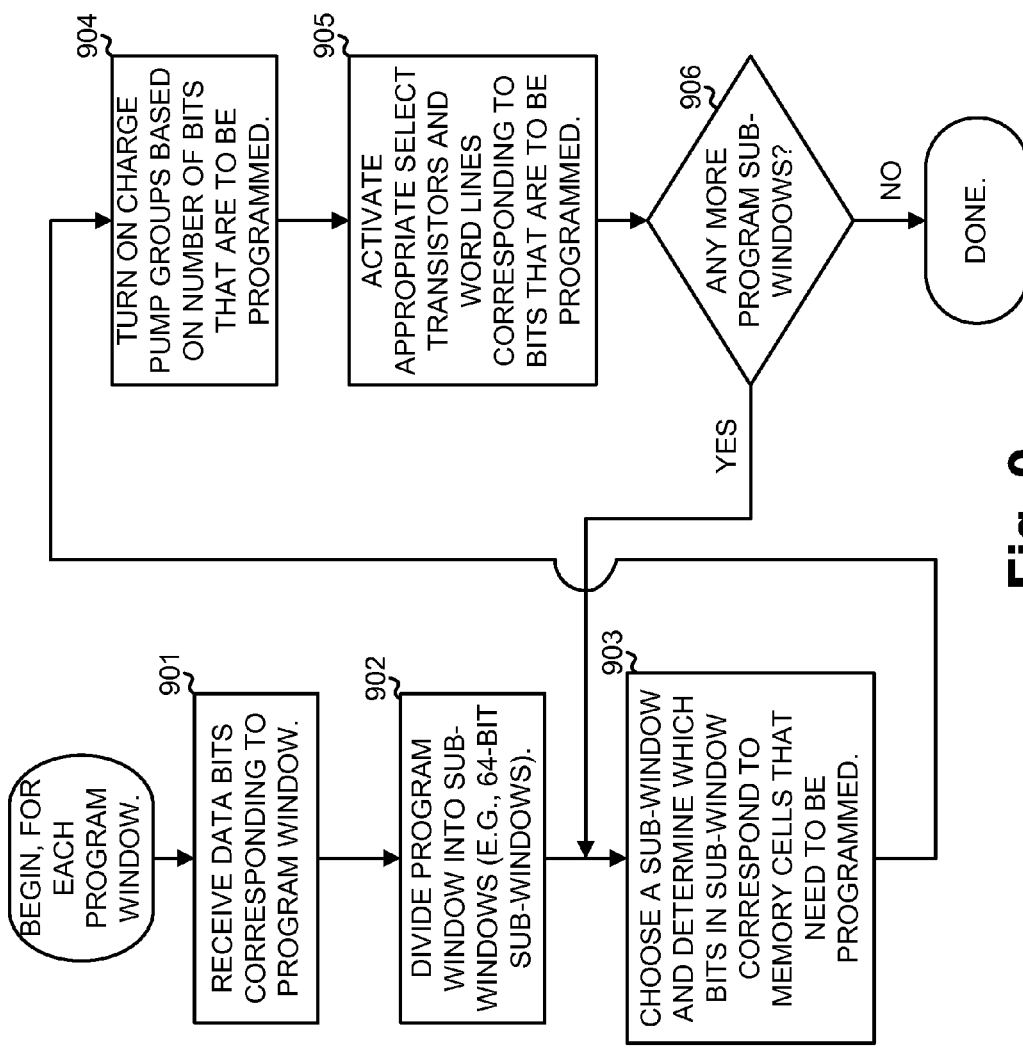
FIG. 9 is a flow chart illustrating exemplary programming of a program window of a memory device.

FIG. 9 is a flow chart illustrating exemplary programming of a programming window of a memory device such as the above-described memory device.

The method begins by receiving a program window, such as program window 715, including the bits that are to be written to memory (act 901). The program window may be received based on data that is externally supplied and is to be written to memory device 100. As mentioned, one possible size for the programming window may be a 256-bit programming window. The programming window 315 may be divided into sub-windows 720, such as four 64-bit sub-windows (act 902). Each sub-window 720 may then be sequentially written to the memory cells. In some possible implementations, multiple sub-windows 720 may be simultaneously written.

For a select sub-window 720 that is to be written, logic in memory device 100, such as, for example, logic in Y-decoder circuitry 108 or control logic 106, may determine which bits in the selected sub-window 720 require programming (act 903). The inverse programming method may be used to minimize the required number of memory cells that need to be programmed.

Appropriate ones of charge pump groups 610-1 through 610-4 may next be turned on depending on the number of bits that require programming (act 904). As one example of this, if there are between zero and eight memory cells that require programming, one charge pump group may be turned on (e.g., 610-1). If there are between nine and 17 cells that require programming, two charge pump groups may be turned on (e.g., 610-1 and 610-2). If there are between 18 and 27 memory cells that require programming, three charge pump groups may be turned on (e.g., 610-1, 610-2, and 610-3). If there are more than 27 memory cells that require programming, all four charge pump groups may be turned on (e.g., 610-1, 610-2, 610-3, and 610-4). The act of "turning on" a charge pump group may, in one implementation, refer to connecting the charge pump group to the memory cells.

The appropriate global bit lines and select transistors S0 through S7 may next be activated to connect the drains of the memory cells that are to be programmed to the turned-on charge pump groups (act 905). Also, the appropriate word line may be supplied with power (act 905). Control logic 106 may apply the appropriate voltages to the global bit lines, select transistors, and word lines. Accordingly, the appropriate memory cells are programmed.

Acts 903-905 may be repeated for each sub-window 720 in programming window 715 (act 906).

CONCLUSION

As described above, multiple independent charge pumps are used to provide power during a memory programming operation. Only the charge pumps needed for a specific programming step are activated. Advantageously, voltage fluctuations may be reduced and less power wasted.

The foregoing description of exemplary embodiments of the invention provides illustration and description, but is not intended to be exhaustive or to limit the invention to the precise form disclosed. Modifications and variations are possible in light of the above teachings or may be acquired from practice of the invention.

Moreover, while series of acts have been described with regard to FIG. 9, the order of the acts may be varied in other implementations consistent with the invention. Moreover, non-dependent acts may be implemented in parallel.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A device comprising:
an array of memory cells,
one or more memory cells, of the array of memory cells, to be programmed based on a programming window that includes a plurality of bits;
logic to:
determine whether first bits, of the plurality of bits, to be programmed correspond to a majority of the plurality of bits,
determine that second bits, of the plurality of bits, are to be programmed when the first bits correspond to the majority of the plurality of bits,
the second bits being different from the first bits,
the first bits not being programmed when the first bits correspond to the majority of the plurality of bits, and
determine that a particular bit, of the plurality of bits, is to be programmed when the first bits correspond to the majority of the plurality of bits,
the particular bit indicating that the second bits are to be programmed; and
a voltage supply to generate a voltage for programming the one or more memory cells based on the programming window,
the voltage supply including a plurality of charge pumps,
a particular number of the plurality of charge pumps being activated based on a number of the second bits and the particular bit when the first bits correspond to the majority of the plurality of bits.

2. The device of claim 1, where the logic is further to:
determine that the first bits do not correspond to the majority of the plurality of bits,
where the one or more memory cells are programmed based on the first bits after determining that the first bits do not correspond to the majority of the plurality of bits.

3. The device of claim 2, where one or more groups of charge pumps, of the plurality of charge pumps, are activated based on a number of the first bits when the first bits do not correspond to the majority of the plurality of bits.

4. The device of claim 1, where the logic is further to:
receive a particular programming window, and
divide the particular programming window into a plurality of sub-windows,
where the plurality of sub-windows include the programming window.

5. The device of claim 4, where the logic is further to:
select another sub-window of the plurality of sub-windows,
where one or more other memory cells, of the array of memory cells, are to be programmed based on the selected other sub-window.

6. The device of claim 5, where the plurality of bits correspond to a first plurality of bits,
where the selected other sub-window includes a second plurality of bits, and
where the logic is further to:
determine that particular bits, of the second plurality of bits, to be programmed do not include a majority of the second plurality of bits,
where the one or more other memory cells are programmed based on the particular bits of the second plurality of bits after determining that the particular bits, of the second plurality of bits, to be programmed do not include a majority of the second plurality of bits.

7. The device of claim 6, where a group of charge pumps, of the plurality of charge pumps, are activated based on the particular bits of the second plurality of bits.

8. A method comprising:
receiving a programming window that includes a plurality of bits to be written to a memory array;
determining whether first bits, of the plurality of bits, to be programmed include a majority of the plurality of bits;
determining that second bits, of the plurality of bits, are to be programmed when the first bits include the majority of the plurality of bits,
the second bits being different from the first bits,
the first bits not being programmed when the first bits include the majority of the plurality of bits;
determining that a particular bit, of the plurality of bits included in the programming window, is to be programmed when the first bits include the majority of the plurality of bits,
the particular bit indicating that the second bits are to be programmed; and
turning on one or more charge pumps to program the memory array using the programming window,
a number of charge pumps, of the one or more charge pumps, being based on a number of the second bits and the particular bit.

9. The method of claim 8, where turning on the one or more charge pumps includes:
turning on one or more groups of charge pumps, of the one or more charge pumps, to program the memory array,
a number of the one or more groups of charge pumps being based on the number of the second bits and the particular bit.

10. The method of claim 8, where receiving the programming window includes receiving a particular programming window, the method further comprising:
dividing the particular programming window into a plurality of sub-windows,
where the plurality of sub-windows include the programming window.

11. The method of claim 10, further comprising:
simultaneously programming particular ones of the plurality of sub-windows; or
sequentially programming at least two of the plurality of sub-windows.

12. The method of claim 10, further comprising:
selecting another sub-window of the plurality of sub-windows; and
programming at least one memory cell of the memory array based on the selected other sub-window.

13. The method of claim 8, further comprising:
determining that the first bits do not include the majority of the plurality of bits; and
programming the memory array based on the first bits after determining that the first bits do not include the majority of the plurality of bits.

14. The method of claim 13, where programming the memory array based on the first bits includes:
turning, based on a number of the first bits, one or more groups of charge pumps to program the memory array.

15. A system comprising:
a device to:
receive a programming window that includes a plurality of bits to be written to one or more memory cells;
determine whether first bits, of the plurality of bits, to be programmed include a majority of the plurality of bits;
determine that second bits, of the plurality of bits, are to be programmed when the first bits include the majority of the plurality of bits,
the second bits being different than the first bits, the first bits not being programmed when the first bits include the majority of the plurality of bits;
determine that a particular bit, of the plurality of bits included in the programming window, is to be programmed when the first bits include the majority of the plurality of bits,
the particular bit indicating that the second bits are to be programmed; and
activate one or more charge pumps to program the one or more memory cells using the programming window,
a number of charge pumps, of the one or more charge pumps, being based on a number of the second bits and the particular bit.

16. The system of claim 15, where the one or more memory cells include silicon-oxide-nitride-oxide-silicon (SONOS) type NOR memory cells.

17. The system of claim 15, where the programming window corresponds to a first sub-window of a plurality of sub-windows, and
where the device is further to:
simultaneously program particular ones of the plurality of sub-windows, or
sequentially program at least two of the plurality of sub-windows.

18. The system of claim 15, where at least one of the plurality of sub-windows includes a 64-bit sub-window.

19. The system of claim 15, where the device is further to:
determine that the first bits do not include the majority of the plurality of bits, and
program the one or more memory cells based on the first bits after determining that the first bits do not include the majority of the plurality of bits.

20. The system of claim 15, where, when activating the one or more charge pumps, the device is to:
activate, based on the number of the second bits and the particular bit, at least one group of charge pumps,
where the at least one group of charge pumps include the one or more charge pumps.

* * * * *